(12) United States Patent
Uehara et al.

(10) Patent No.: US 6,815,773 B2
(45) Date of Patent: Nov. 9, 2004

(54) SEMICONDUCTOR DEVICE AND METHOD OF MANUFACTURING THE SAME

(75) Inventors: Osamu Uehara, Chiba (JP); Jun Osanai, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/387,075

(22) Filed: Mar. 12, 2003

(65) Prior Publication Data

US 2003/0178679 A1 Sep. 25, 2003

(30) Foreign Application Priority Data

Mar. 19, 2002 (JP) ........................................ 2002-075655

(51) Int. Cl.$^7$ ............................................. H01L 27/01
(52) U.S. Cl. ..................... 257/347; 257/349; 438/217
(58) Field of Search ................................. 257/347, 349; 438/217

(56) References Cited

U.S. PATENT DOCUMENTS 5,138,409 A * 8/1992 Kawai ........................ 257/327
5,359,219 A * 10/1994 Hwang ........................ 257/351

* cited by examiner

Primary Examiner—Sara Crane
(74) Attorney, Agent, or Firm—Adams & Wilks

(57) ABSTRACT

A semiconductor device is provided in which: a parasitic capacitance between a drain and a supporting substrate is reduced; and a high electric field generated in the vicinity of the drain is relaxed and which has a high withstand voltage. A MOS transistor according to the present invention includes: a supporting substrate region in an SOI substrate; a buried insulating film formed on the supporting substrate region; a channel region formed on the buried insulating film; and first and second offset regions that are formed on the buried insulating film so as to be adjacent to the channel region on both sides thereof, and further includes an impurity diffusion region formed in a portion positioned below the second offset region in the supporting substrate region.

18 Claims, 3 Drawing Sheets

US 6,815,773 B2

SEMICONDUCTOR DEVICE AND METHOD OF MANUFACTURING THE SAME

BACKGROUND OF THE INVENTION

1. Field of the Invention

The present invention relates to a transistor having an SOI (silicon on insulator) structure and a method of manufacturing the same, and more specifically to a method of manufacturing a transistor having a SOI structure in which a buried insulating film can be increased in thickness with satisfactory controllability, and a parasitic capacitance between a drain and a supporting substrate is reduced and also, a high concentration impurity diffusion region is formed in the supporting substrate region below a low concentration drain region, thereby being capable of dealing with an increase in the withstand voltage of the transistor and high-speed operation.

2. Description of the Related Art

In a conventional semiconductor device with an SOI structure, an SOI substrate is used, and thus, a field insulating film and a buried insulating film contact with each other to attain electrically complete separation. Therefore, the semiconductor device is soft error-free and latchup-free. Further, a parasitic capacitance is reduced by using the SOI substrate, and thus, a high-speed IC can be realized. Moreover, the semiconductor device has an advantage that improvement in transistor characteristics enables a low-power-consumption IC and other advantages.

The conventional semiconductor device that employs an SOI substrate has many advantages, including high speed operation, low power consumption, being free of soft errors, and being latchup-free as compared with a conventional semiconductor device that employs a bulk silicon substrate, but has a problem in that the withstand voltage thereof is reduced due to a high electric field generated in a surface in the vicinity of a drain below a gate, similarly to the conventional semiconductor device that employs a silicon substrate.

SUMMARY OF THE INVENTION

In order to obtain a structure for relaxing an electric field at a drain end, according to an aspect of the present invention, there is provided a manufacturing method comprising the steps of forming a mask film on a region which corresponds to a channel region and a low concentration drain region of a transistor which are formed later, in a surface of an SOI substrate with the use of the SOI substrate, implanting oxygen ions into the surface of the SOI substrate to locate peaks of an impurity concentration in an upper portion and a lower portion of a buried insulating film performing heat treatment on the SOI substrate that has been implanted with oxygen ions to form a buried insulating film having a thin portion corresponding to the channel region and the low concentration drain region and thick portions corresponding to other portions, and implanting impurity ions into a supporting substrate region below the low concentration drain region to form a high concentration impurity diffusion layer.

DETAILED DESCRIPTION OF THE PREFERRED EMBODIMENTS

Figure 1:
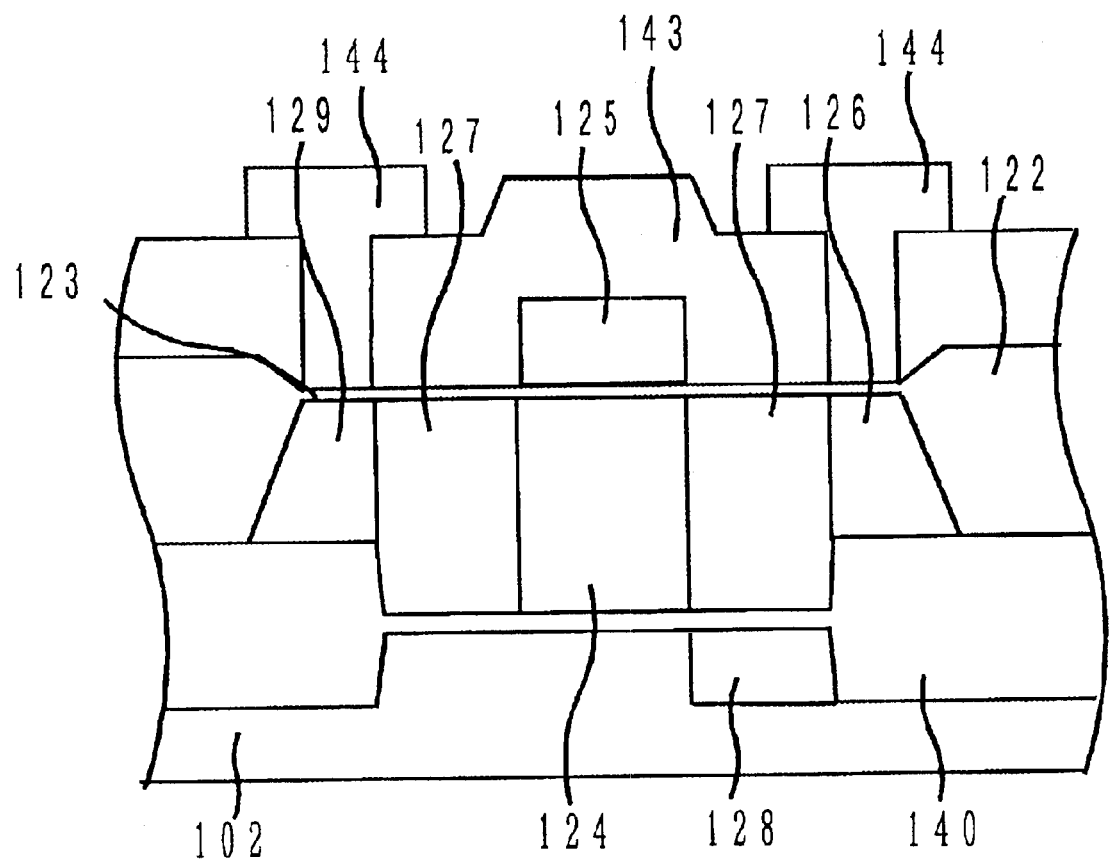
FIG. 1 is a sectional view of a MOS type N-channel transistor in accordance with an embodiment of the present invention.

Hereinafter, an embodiment of the present invention will be described. FIG. 1 is a sectional view of an N-channel transistor in accordance with an embodiment of the present invention. In a MOS transistor 145 with an SOI structure, a buried insulating film 140 is increased in thickness with satisfactory controllability, thereby reducing a parasitic capacitance between a drain region 126 and a supporting substrate region 102. Further, a so-called low concentration offset region 127, which is a low concentration drain region and is adjacent to a channel region 124, is depleted by a P+type impurity diffusion region 128 located below the region 127, and thus, a high electric field generated in the vicinity of the drain region 126 can be relaxed. Therefore, a withstand voltage can be increased compared with the conventional transistor with an SOI structure.

Note that a gate insulating film 123, a gate electrode 125, the low concentration offset regions 127, a source region 129, and the drain region 126 are formed through the same steps as those in a normal MOS manufacturing method, and further, an interlayer insulating layer 143 and an electrode layer 144 are formed.

FIGS. 2A and 2B and FIGS. 3A to 3C are sectional views of steps showing the N-channel transistor in accordance with the embodiment of the present invention.

Figure 2A:
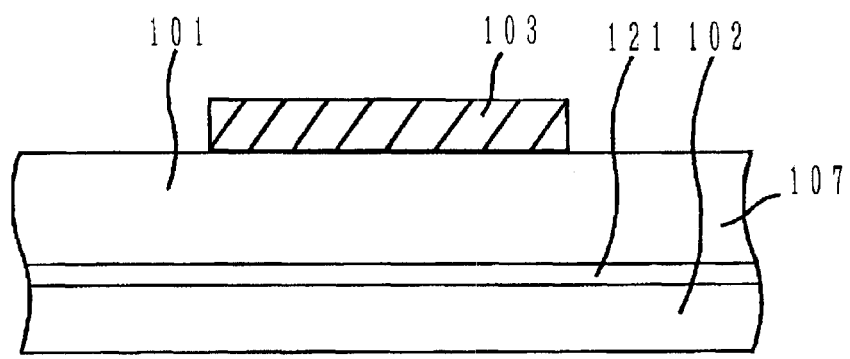
FIGS. 2A and 2B are sectional views showing in step order a method of manufacturing the MOS type N-channel transistor in accordance with the embodiment of the present invention.

In the transistor according to the present invention, as shown in FIG. 2A, a mask film 103 is formed on a surface of an SOI substrate 101 so as to cover the channel region 124 and the low concentration offset regions 127 of the transistor, which are formed later. Patterning of the mask film 103 is performed with photolithography and etching. A silicon oxide film, a silicon, nitride film, a polysilicon film, or the like, which is formed by a thermal oxidization method or CVD method, is used as the mask film. A thickness of a buried insulating film 121 is, for example, 30 nm, and a thickness of a semiconductor layer 107 is, for example, 120 nm.

Figure 2B:
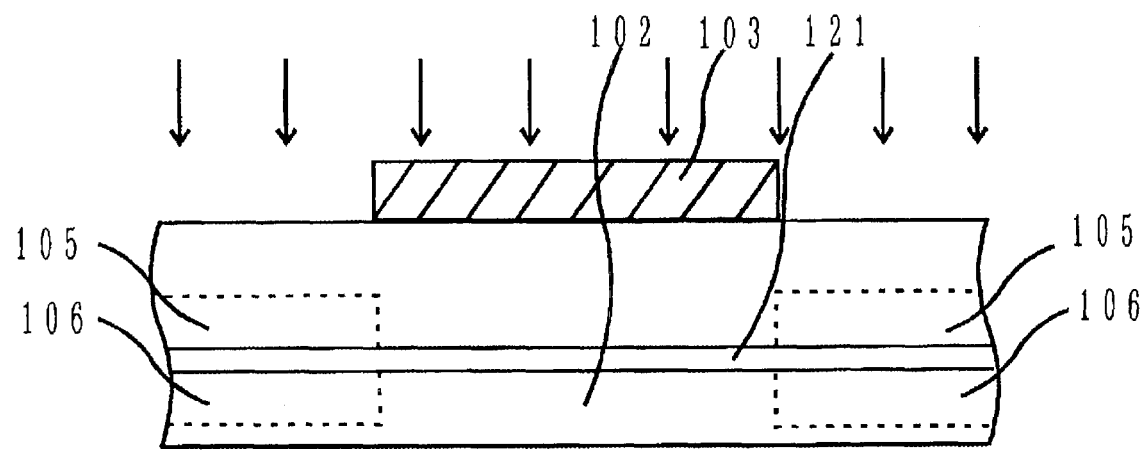

Subsequently, as shown in FIG. 2B, implantation of oxygen ions is performed from the surface of the SOI substrate 101. The oxygen ions implanted from the surface of the SOI substrate 101 are selectively introduced into regions other than the channel region 124 and the low concentration offset regions 127 due to the existence of the mask film 103. The oxygen ions are implanted such that peaks of an impurity concentration are located in an upper portion and a lower portion of the buried insulating film 121, so that a buried insulating film upper portion oxygen implantation layer 105 and a buried insulating film lower portion oxygen implantation layer 106 are formed. At this time, the condition of ion implantation for the upper portion of the buried insulating film 121 is, for example, $1\times10^{18}$ cm$^{-2}$ at 210 Kev, and further, the condition of ion implantation for the lower portion of the buried insulating film 121 is, for example, $1\times10^{18}$ cm$^{-2}$ at 240 KeV.

Figure 3A:
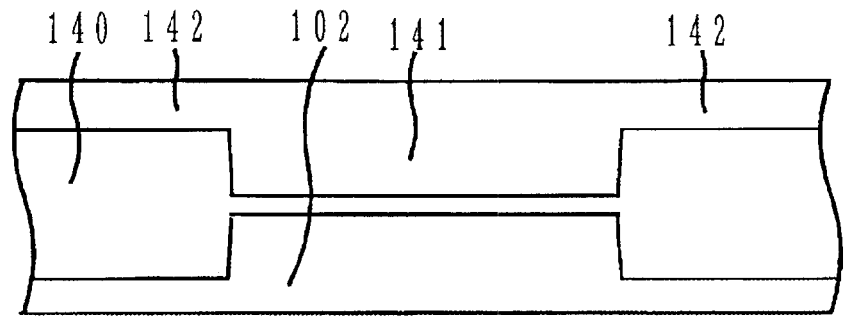
FIGS. 3A to 3C are sectional views showing in step order the method of manufacturing the MOS type N-channel transistor in accordance with the embodiment of the present invention.

Then, the mask film is removed. Thereafter, as shown in FIG. 3A, the SOT substrate 101 is subjected to heat treatment to form a buried insulating film 140 in the portion equivalent to the buried insulating film upper portion oxygen implantation layer 105 and the buried insulating film lower portion oxygen implantation layer 106. As a result, there is obtained a structure in which semiconductor layers 141 and 142, which have a thick portion corresponding to the channel region 124 and the low concentration offset regions 127 and thin portions corresponding to the other portions, are on a surface of the buried insulating film 140. The heat treatment is performed with the condition of a temperature of, for example, 1100° C. to 1300° C. A thickness of the thin semiconductor layer 142 is, for example, 70 nm. Further, a thickness of a thick portion of the buried insulating film 140 is, for example, 130 nm.

Figure 3B:
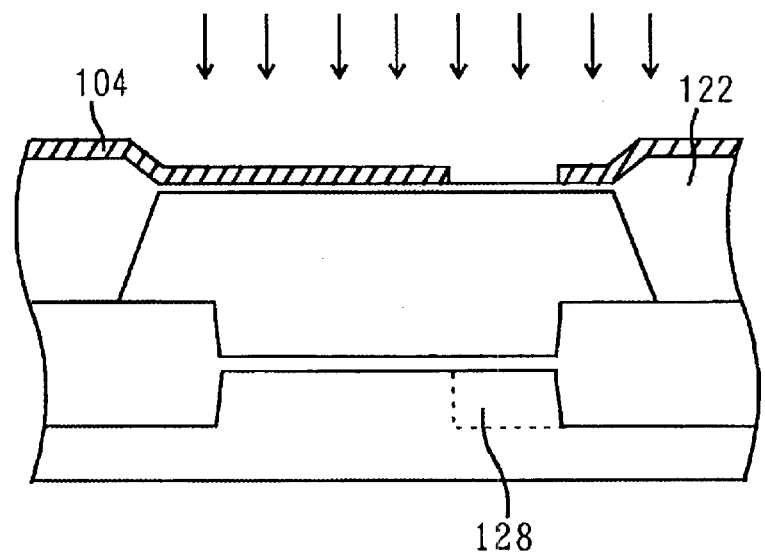

Subsequently, as shown in FIG. 3B, a field insulating film 122 is formed in order to separate surfaces of the semiconductor layers 141 and 142 for each element, and a mask film 104 is formed using a pattern corresponding to the low concentration offset region 127 formed later. Patterning of the mask film 104 is performed with photolithography and etching. A silicon oxide film, a silicon nitride film, a polysilicon film, or the like, which is formed by a thermal oxidization method or CVD method, is used as the mask film. Ions of boron or $BF_2$ at a high concentration are implanted onto the supporting substrate region 102, so that the P+type impurity diffusion region 128 is formed. The condition of ion implantation is, for example $1 \times 10^{16}$ cm$^{-2}$ at 50 KeV. The P+type impurity diffusion region 128 is formed, whereby the low concentration offset region 127 thereon is depleted, and the high electric field in the vicinity of the drain is relaxed.

Figure 3C:
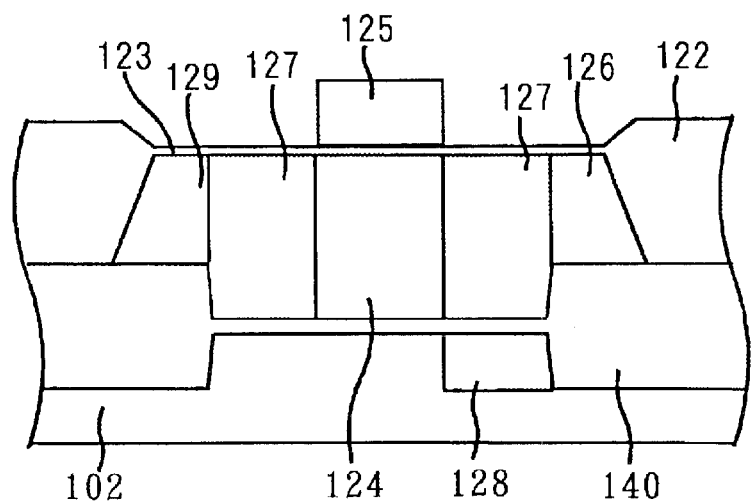

Thereafter, as shown in FIG. 3C, the gate insulating film 123, the gate electrode 125, the low concentration offset regions 127, the source region 129, and the drain region 126 are formed through the same steps as those in the normal MOS manufacturing method. Further, the interlayer insulating layer 143 and the electrode layer 144 are formed thereon. Accordingly, the structure shown in FIG. 1 can be obtained.

As has been described above, according to the present invention, the semiconductor device can be manufactured in which: the buried insulating film can be increased in thickness with satisfactory controllability, and the parasitic capacitance between the drain and the supporting substrate is reduced; and the high electric field generated in the vicinity of the drain can be relaxed and which has a large withstand voltage compared with the conventional semiconductor device with the SOI structure.

What is claimed is:

1. A MOS transistor comprising:
   an SOI substrate having a supporting substrate, an insulating film having a thinner portion and a thicker portion provided on the supporting substrate, and a semiconductor layer having a thinner portion and a thicker portion provided on the insulating film; a channel region formed in the thicker portion of the semiconductor layer; first and second offset regions formed in the thicker portion of the semiconductor layer on opposite sides of the channel region; a drain region formed in the thinner portion of the semiconductor layer in contact with the first offset region on one side of the channel region; a source region formed in the thinner portion of the semiconductor layer in contact with the second offset region on an opposite side of the channel region; a gate insulating film formed on the semiconductor layer over the channel region, the first and second offset regions, and the source and drain regions; a gate electrode formed on the gate insulating film and positioned above the channel region; and an impurity diffusion region formed in the supporting substrate directly below the second offset region.

2. A MOS transistor according to claim 1; further comprising a field insulating film formed over the semiconductor layer in contact with the source and drain regions.

3. A MOS transistor according to claim 1; wherein the channel region has an N-type conductivity.

4. A MOS transistor according to claim 3; wherein the impurity diffusion region formed directly below the second offset region has a P$^+$-type conductivity.

5. A MOS transistor according to claim 1; wherein the insulating film is a buried insulating film.

6. A MOS transistor according to claim 1; wherein the impurity diffusion region formed directly below the second offset region is effective to deplete the first offset region to relax a high electric field generated in the vicinity of the drain region.

7. A method of manufacturing a MOS transistor comprising the steps of:
   providing an SOI substrate having a supporting substrate, an insulating film provided on the supporting substrate, and a semiconductor layer provided on the insulating film;
   forming a mask on a surface of the semiconductor layer over a region in which a channel region and a low concentration drain region of the MOS transistor are to be subsequently formed;
   implanting oxygen ions into the surface of the SOI substrate on opposite sides of the mask to form impurity concentration regions having peaks located above and below the insulating film;
   performing heat treatment on the SOI substrate after implanting the oxygen ions to increase a thickness of the insulating film in portions where the impurity concentration regions were formed, so that the insulating film and the semiconductor layer each have a thinner portion and a thicker portion;
   implanting impurity ions into the supporting substrate to form a high concentration impurity diffusion region directly below a region where a low concentration drain region is to be formed;
   forming source and drain regions in the thinner portion of the semiconductor layer;
   forming a low concentration source region in the thicker portion of the semiconductor layer directly adjacent to the source region; and
   forming a low concentration drain region in the thicker portion of the semiconductor layer directly adjacent to the drain region.

8. A method of manufacturing a MOS transistor according to claim 7, further comprising the step of forming a field insulating film over the semiconductor layer in contact with the source and drain regions.

9. A method of manufacturing a MOS transistor according to claim 7; wherein the step of implanting impurity ions into the supporting substrate to form a high concentration impurity diffusion region comprises the step of implanting P$^+$-type impurities into the supporting substrate.

10. A method of manufacturing a MOS transistor according to claim 7; wherein the insulating film is a buried insulating film.

11. A method of manufacturing a MOS transistor according to claim 7; wherein the high concentration impurity diffusion region formed directly below the second offset region depletes the first offset region to relax a high electric field generated in the vicinity of the drain region.

12. A MOS transistor according to claim 1; wherein the channel region is formed over the thinner portion of the insulating film, the first and second offset regions are formed over the thinner portion of the insulating film, and the source and drain regions are formed over the thicker portion of the insulating film.

13. A MOS transistor comprising: an SOI substrate having a supporting substrate, an insulating film having a thinner portion and a thicker portion provided on the supporting substrate, and a semiconductor layer provided on the insulating film; a channel region formed in the semiconductor layer over the thinner portion of the insulating film; first and second offset regions formed in the semiconductor layer on opposite sides of the channel region and over the thinner portion of the insulating film; a drain region formed in the semiconductor layer in contact with the first offset region on one side of the channel region and over the thicker portion of the insulating film; a source region formed in the semiconductor layer in contact with the second offset region on an opposite side of the channel region and over the ticker portion of the insulating film; a gate insulating film formed on the semiconductor layer over the channel region, the first and second offset regions, and the source and drain regions; a gate electrode formed on the gate insulating film and positioned above the channel region; and an impurity diffusion region formed in the supporting substrate directly below the second offset region.

14. A MOS transistor according to claim 13; further comprising a field insulating film formed over the semiconductor layer in contact with the source and drain regions.

15. A MOS transistor according to claim 13; wherein the channel region has an N-type conductivity.

16. A MOS transistor according to claim 15; wherein the impurity diffusion region formed directly below the second offset region has a $P^+$-type conductivity.

17. A MOS transistor according to claim 13; wherein the insulating film is a buried insulating film.

18. A MOS transistor according to claim 13; wherein the impurity diffusion region formed directly below the second offset region is effective to deplete the first offset region to relax a high electric field generated in the vicinity of the drain region.

* * * * *